United States Patent [19]

Wiggers

[11] Patent Number: 5,397,981
[45] Date of Patent: Mar. 14, 1995

[54] DIGITAL STORAGE OSCILLOSCOPE WITH AUTOMATIC TIME BASE

[75] Inventor: Berts H. Wiggers, Rijssen, Netherlands

[73] Assignee: Fluke Corporation, Everett, Wash.

[21] Appl. No.: 203,974

[22] Filed: Feb. 28, 1994

[51] Int. Cl.$^6$ ............................................. G01R 13/20
[52] U.S. Cl. ............................... 324/121 R; 324/394; 324/379; 364/487
[58] Field of Search ............ 364/431.01, 431.02, 364/431.03, 431.04, 487; 324/394, 379, 121 R; 340/347

[56] References Cited

U.S. PATENT DOCUMENTS

| | | | |
|---|---|---|---|
| 4,236,151 | 11/1980 | Russ | 324/121 R |
| 4,399,407 | 8/1983 | Kling | 324/379 |
| 4,476,531 | 10/1984 | Marino | 364/487 |
| 4,716,345 | 12/1987 | Shank | 324/121 R |
| 4,736,189 | 4/1988 | Katsumata | 340/347 |
| 4,743,844 | 5/1988 | Oldenheimer | 324/121 R |
| 5,072,168 | 12/1991 | Ferguson | 324/121 R |
| 5,138,252 | 8/1992 | Ferguson | 324/121 R |
| 5,155,431 | 10/1992 | Holcomb | 364/487 |
| 5,160,892 | 11/1992 | Makhija | 324/379 |
| 5,212,485 | 5/1993 | Shank | 324/121 R |
| 5,223,784 | 6/1993 | Nelson | 324/121 R |
| 5,227,716 | 7/1993 | Heuvel | 364/487 |
| 5,235,270 | 8/1993 | Shimada | 324/121 R |

*Primary Examiner*—Kenneth A. Wieder
*Assistant Examiner*—Mark A. Wardas
*Attorney, Agent, or Firm*—George T. Noe

[57] ABSTRACT

A digital storage oscilloscope capable of acquiring and displaying input signals over a wide range of frequencies, and automatically establishing, by menu setups or user selection, any of a number of cycles of an input signal for viewing. An input analog electrical signal is sampled at a constant rate and then stored in a fast-acquisition memory. A DSP and a CPU combine to provide an automatic time base which maintains constant width of displayed signals without changing the sampling rate. The time period of one cycle of signal is measured, and the number of digitized samples is reduced or increased by the DSP to provide constant number of samples in order to maintain a constant-width display despite any changes in the input signal frequency. Additionally, the oscilloscope horizontal display axis may be expressed in degrees per division as well as time per division. Thus, an oscilloscope user can select one or more cycles, or portions of cycles, for viewing, and the oscilloscope will automatically establish the desired display.

6 Claims, 2 Drawing Sheets

DIGITAL STORAGE OSCILLOSCOPE WITH AUTOMATIC TIME BASE

BACKGROUND OF THE INVENTION

This invention relates generally to digital storage oscilloscopes, and in particular to a digital storage oscilloscope with an automatic time base which automatically establishes displays of a selected number of cycles, or portions of cycles, and provides the appropriate scaling information for the waveform of an input electrical signal.

In a conventional digital storage oscilloscope, input analog electrical signals are sampled at a known rate to acquire digital representations of instantaneous signal amplitudes (samples). The samples, now in the form of digital data, are stored in a memory having a finite record length which is typically equivalent to one screen width of displayed waveform. Thereafter, the digital data may be recalled from the memory, processed and converted back to analog values, and displayed at a known display-clock rate to reconstruct and replicate graphic waveforms of the original input analog signals.

A common problem associated with digital oscilloscopes is establishing a stored image of the signal of interest, particularly if the signal waveform is complex and only a small portion of it is of interest, or if the frequency of the input signal is changing. It has become commonplace to utilize the computing power available in more sophisticated oscilloscopes to analyze an input signal and provide event recognition for triggering and automatic time base adjustments to aid the user in obtaining a usable display. A setup procedure is carried out by software wherein through a time-consuming, iterative acquire, analyze and adjust procedure, the triggering and time base sweep rate are established to provide an intelligible display. In actual practice, however, such automatic setup and ranging has its failures and shortcomings. For example, in addition to being very slow and time consuming, this approach for use in digital storage oscilloscopes is prone to errors and may miss signals entirely, particularly if the amplitudes and frequencies of the input signal are changing, or if the signals are occurring at a very low frequency or repetition rate.

One measurement situation in particular that does not lend itself to conventional automatic setup procedures is the waveform analysis of rotating machinery such as internal combustion engines because the area of interest may occur at a specific crank angle that is related to other factors. For example, in a four-stroke diesel engine wherein one complete engine cycle requires two revolutions of the crankshaft (or 720 degrees), the area of interest may be signals related to needle lift, ignition pulses, or fuel pump signals.

U.S. Pat. No. 4,399,407 to Kling et al. teaches an engine analyzer in which the period of a single engine cycle is measured, and a computer uses the measurement to vary the sample clock rate of an analog-to-digital converter (ADC) during signal or waveform acquisition so that the ADC always produces a constant number N of samples in the form of digital data. This allows relatively simple circuitry to store and display the N samples representing a single cycle in a constant screen width. For this system to operate properly, a variable clock is required, and new clock rates continually must be computed before a signal can be acquired. For the relatively slow signals of an engine analyzer, the time delays between acquired signals may be tolerated.

Other measurement situations not suitable for conventional automatic setup procedures include frequency-response and variable-phase signal testing and measurements associated with voltage-controlled oscillators and variable frequency transducers. In such situations, it would be desirable to specify the number of cycles to be acquired for viewing.

Another measurement situation that has been cumbersome and difficult in the past is measuring degrees along the horizontal axis. For example, The typical method of measuring the injection timing of internal combustion engines is to put markers on one trace which represent the angular position of the crankshaft. Such markers are manually aligned with graticule scale lines on the oscilloscope display by adjusting the variable time base and horizontal position controls. The oscilloscope user must mentally convert the scale to a number of degrees per division to interpret the measurement. A small change in engine speed means the manual screen calibration must be repeated.

What is desired is a general purpose digital storage oscilloscope capable of acquiring and displaying input signals over a wide range of frequencies, and automatically establishing, by menu setups or user selection, any of a number of cycles of an input signal for viewing, and an oscilloscope that is capable of rapidly adapting to changes in signal frequency automatically in order to maintain a fixed display despite the changes. Additionally, for such applications, it would be desirable to provide an oscilloscope horizontal display axis which could be expressed in degrees per division as well as time per division.

SUMMARY OF THE INVENTION

In accordance with the present invention, a digital storage oscilloscope having an automatic time base has been developed which has the foregoing and other capabilities and features.

An input repetitive electrical signal is sampled at a constant rate, producing a stream of digital samples which are applied to an acquisition unit at a constant rate and then stored in a fast-acquisition memory (FAM). When the acquisition unit receives a trigger signal from an associated trigger circuit, acquisition of a signal is complete and the stored samples are transferred to a main acquisition memory (MAM). The acquisition unit includes a digital signal processor (DSP) that preprocesses the digital samples in accordance with a calculated time base reduction factor (TBRF) provided by a system CPU to provide a waveform display memory resolution of a predetermined number, e.g., 50, samples per division. The acquisition unit also measures the time period of one cycle of the input repetitive signal for each completed acquisition, and adjusts the number of digitized samples per display division to update each display following acquisition so that the width of the display remains constant despite changes in frequency of the input repetitive signal. Additionally, the oscilloscope horizontal display axis may be expressed in degrees per division as well as time per division. Thus, an oscilloscope user can select one or more cycles, or portions of cycles, of a waveform of an input signal for viewing, and the oscilloscope will automatically establish the desired display.

It is therefore one feature of the present invention to provide a digital storage oscilloscope with an automatic time base which automatically provides displays of one or more cycles, or a selected portion of a cycle, of a waveform of an electrical signal.

It is another feature of the present invention to provide a digital storage oscilloscope with an automatic time base which automatically provides a constant-width display of one or more cycles, or a selected portion of a cycle, of a waveform of an electrical signal despite changes in input signal frequency.

It is yet another feature of the present invention to provide a digital storage oscilloscope with an automatic time base which automatically provides a constant-width display of one or more cycles, or a selected portion of a cycle, of a waveform of an electrical signal despite changes in input signal frequency in appropriately scaled time or degrees.

Other features and advantages of the present invention will become obvious to those having ordinary skill in the art upon a reading of the following description when taken in conjunction with the accompanying drawings.

DETAILED DESCRIPTION OF THE INVENTION

Figure 1:
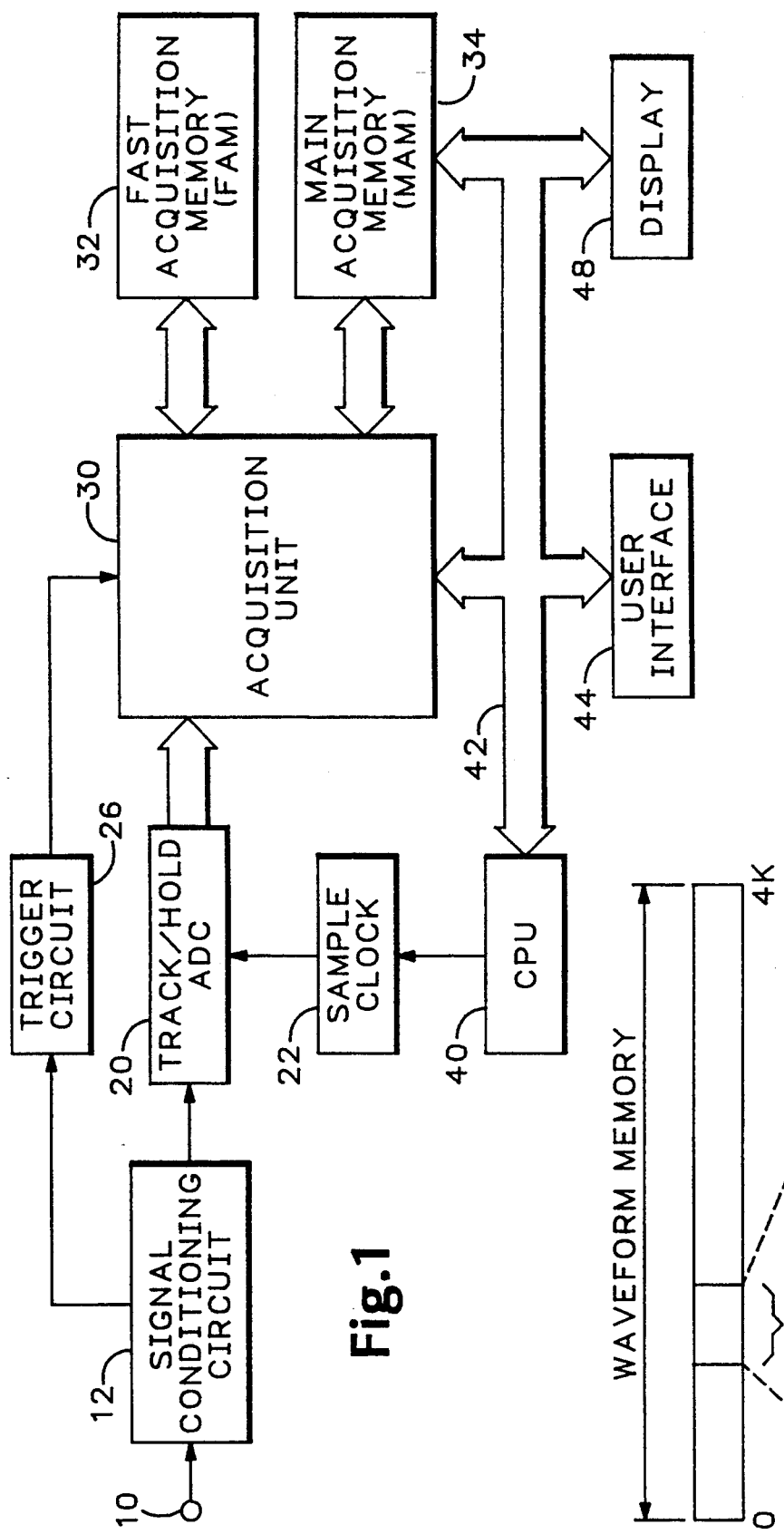
FIG. 1 is a generalized block diagram of a portion of a digital storage oscilloscope having an automatic time base in accordance with the present invention.

Referring to FIG. 1 of the drawings, there is shown a generalized block diagram of a portion of a digital storage oscilloscope having an automatic time base in accordance with the present invention. An input repetitive electrical signal is applied via an input terminal 10 to a signal conditioning circuit 12. Signal conditioning circuit 12 may include conventional attenuators and gain-switching preamplifiers to adjust the input signal amplitude to a suitable level. The preamplified electrical signal is then applied to a track-and-hold circuit/analog-to-digital converter (ADC) 20, which converts instantaneous values of the input signal to digitized samples at a constant rate determined by a sample clock 22. The digitized samples are sent to an acquisition unit 30 for processing and storage. In a commercial embodiment, the ADC 20 is a conventional 8-bit flash converter, and the sample clock 22 produces sample clock pulses at a fixed, constant rate of 100 megahertz.

Also, a replica of the input signal is applied from signal conditioning circuit 12 to a conventional trigger circuit 26, which may include any of a number of known trigger event recognition circuits for issuing valid trigger signals to the acquisition unit 30 upon the occurrence of an event preselected by a user, such as a particular signal pattern or signal level.

The acquisition unit 30 receives the digitized samples from ADC 20 and transports them to a fast acquisition random-access memory (FAM) 32. When a triggering event is detected, that is, when a trigger signal from trigger circuit 26 is received, the acquisition is stopped and digital data representing the waveform of the input analog signal is retrieved from FAM 32, processed (as will be described in detail later), and moved to a much slower main acquisition random-access memory (MAM) 34 from which the digital data also may be processed and subsequently reconstructed into analog form for display.

The acquisition unit 30 in the above-mentioned commercial embodiment is a digital application-specific integrated circuit (ASIC) combined with a digital signal processor (DSP), such as a TMS320C25 manufactured by Texas Instruments, having its own internal controller, program memory, and bus structure for processing the digital data at an internally-determined 40 megahertz rate. It should be mentioned that the custom-made ASIC portion of acquisition unit 30 is specific to the applications, functions and features of a commercial digital storage oscilloscope, and is capable of performing other functions that are not part of this invention, such as, for example, glitch detection and min/max detection. However, commercially-available DSPs, such as, for example, a Motorola DSP56000 as well as the TI TMS320C25 mentioned above, could be combined with added hardware by one skilled in the art and programmed in accordance with instructions disclosed herein to carry out the signal processing in accordance with the present invention.

Figure 2:
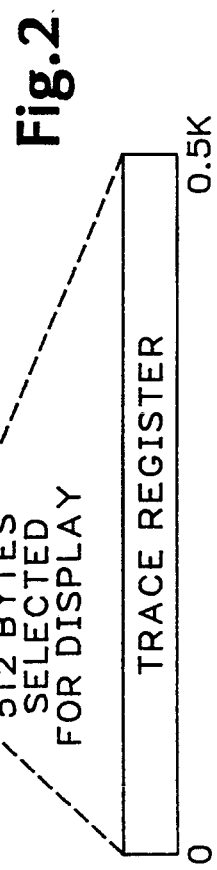
FIG. 2 is a representation of memory maps of a waveform memory and an associated trace register containing one screen width of display.

FAM 32 and MAM 34 in the commercial embodiment each have a record length of 32K (32,000 data samples), which may be partitioned in increments of 16K, 8K, 4K, 2K, 1K, and 0.5K, depending on the operating mode and number of input channels (up to four) being viewed. The smallest portion of memory partitioned (nominally 0.5K) is used as a trace register and corresponds to one screen-width of display. and therefore contains digital data representing the waveform amplitudes at each of a predetermined number, e.g. 500, of waveform points located at equally-spaced intervals along the horizontal axis of the display. While the trace register capacity is nominally 0.5K, it is actually 512 bytes (12 bytes are not used). In operating modes in which a small portion of an overall waveform is to be viewed, such as, for example, in sweep magnification operation, the acquired waveform is first stored in larger memory than the display memory. For example, if the trace register or display memory capacity is nominally 0.5K, the waveform is first stored in a larger incremental memory, such as 4K or 8K. Then, the portion of the waveform that the display represents is selected and stored in the trace register. Refer to the memory maps shown in FIG. 2.

A CPU 40, which suitably may be a conventional microprocessor and its associated kernel devices, provides overall control of the system, and is connected via a CPU bus 42 to acquisition unit 30, MAM 34, a user interface 44 and a display unit 48. CPU 40 operates in accordance with its own stored program instructions and operator-selected control information from the user interface 44, which may suitably include a front-panel control system or a keyboard, as well as a microcontroller to scan and interpret the operator selections and commands to provide the operator-selected control information to CPU 40. The MAM 34, in addition to storing digital data representative of the waveform of the input analog signal, stores textual information and other information from CPU 40. CPU 40 establishes the operating mode of acquisition unit 30, calculates measurement results, and sends information for display, including digital waveform data and textual information from MAM 34, to display unit 48. Display unit 48 may include any of a number of well-known available devices having a viewing screen suitable for displaying signal waveforms and textual information, such as a cathode-ray tube or a flat-panel liquid-crystal display, and also may include digital-to-analog converters and the vertical and horizontal display drivers necessary to replicate original signals, or portions or derivatives thereof, from the digital waveform data as well as to provide display of textual information.

MANUAL TIME BASE MODE

First to be discussed, in order to gain a full appreciation of the automatic time base mode to be described later, is the method in which the acquisition unit 30 handles waveform data in the manual time base mode wherein an oscilloscope user selects the horizontal sweep rate. As mentioned earlier, ADC 20 converts instantaneous signal values to digitized samples at a fixed, constant rate. Generally, this sampling rate is chosen at the factory to accommodate the fastest sweep rate setting of the oscilloscope. That is, if the fastest sweep rate setting is 0.5 microseconds (500 nanoseconds) per division for a conventional ten-division horizontal display, the sampling rate should provide a predetermined number of samples, e.g., 50 samples per division, to permit high-resolution reconstruction of the waveform for display. For example, consider an oscilloscope in which calibrated sweep rates are selectable from a relatively slow speed, e.g., one second per division, to a relatively fast speed, e.g., 500 nanoseconds (0.5 microseconds) per division, in a 1-2-5 step sequence. A sampling rate of 100 megasamples per second (chosen for ease of description) would result in a sample taken every ten nanoseconds, so that 50 samples could be used to reconstruct one division of display at 500 nanoseconds per division. This implies that data reduction or compression between the ADC 20 and FAM 32 is required for slower sweep rates in order to keep the size of the fast-acquisition memory to an acceptable record length. Thus, one of the first tasks for acquisition unit 30 is to sub-sample the flow of digitized samples in such a way that for every sweep rate, the required amount or number of samples are selected and placed into FAM 32 to provide a complete screen width of display.

Based on the foregoing premise of 50 samples per division, an entire ten-division (one screen width) display may be reconstructed from 500 samples for any sweep rate that is selected. Let us assume, then, that the record lengths of the FAM 32 and MAM 43 are chosen to store 500 samples representing the amplitudes of waveform points. As a practical matter, it should be mentioned that the record length could vary in accordance with user-selected modes, such as waveform expansion or compression, as discussed above, where additional resolution or detail is needed and so more memory space would be needed. As the sweep rate is decreased, with sampling rate and record length being held constant, a proportional number of samples must be discarded in order to compress the waveform data. Suppose a sweep rate of one microsecond per division is selected, slowing the sweep rate by one-half from the above-described 500 nanoseconds per division. This implies that every other sample must be discarded so that the samples that are stored are ones taken 20 nanoseconds apart. This is achieved by a time base reduction factor (TBRF) provided by CPU 40 to acquisition unit 30, which then reduces the number of samples accordingly. CPU 40 reads the operator-selected time base settings and record lengths, and determines a TBRF which is equal to the time base sweep rate (in nanoseconds per division) divided by the sampling period (in nanoseconds) multiplied by the number of stored samples per division. Thus, for a sweep rate of one microsecond per division, a sampling period of ten nanoseconds, and 50 stored samples per division, $TBRF = 1000/(10 \times 50) = 2$. This TBRF value is furnished to acquisition unit 30, which responds by placing every second digitized sample in the stream of digitized samples from ADC 20 into FAM 32. The samples not placed in memory are simply discarded. Similarly, it can be discerned that for other selected sweep rates, new TBRF calculations are similarly made and the appropriate samples are placed in memory. As an example, for a sweep rate of one millisecond per division, $TBRF = 2000$, meaning that acquisition unit 30 must place every 2000 th sample in FAM 32 while discarding the 1999 samples that occur between each of the samples that are stored.

During manual time base mode operation, ADC 20, acquisition unit 30, and FAM 32 are started, either automatically or on command by a user, and operate continuously until acquisition is stopped by receipt of a trigger signal. At this point, acquisition is complete-that is, enough digitized samples have been accumulated and stored in FAM 32 to permit reconstruction of a screen-width of displayed waveform. Thereafter, the digitized samples stored in FAM 32 may be further processed and transported to the MAM 34. Of course, the acquisition circuits may be re-started and new waveforms acquired on command or automatically on a repetitive basis to provide updated displays, as is well known in the art.

AUTOMATIC TIME BASE MODE

In the automatic time base mode, the user or operator selects a desired time period or particular number of cycles (or portion of a cycle) of a generally repetitive (but perhaps varying in frequency) signal waveform to be displayed, and the system automatically analyzes the signal and establishes the desired display. Thus, in the automatic time base mode, acquisition unit 30 must handle the digitized samples in such a way that leads to a fixed number of waveform periods on the display, independent of input signal frequency. This is achieved generally by measuring the time period of one cycle of an acquired input signal, and calculating the total time for a desired number of cycles to be displayed. The measured time period and calculated total time are compared with the desired time period and number of cycles, and the TBRF is increased or decreased automatically so that acquisition unit 30 places the required digitized samples in FAM 32 to result in a constant number of cycles on the display screen despite changes in the frequency of the input signal.

The constant number of cycles of displayed signal waveform maintained by the automatic time base gives rise to the relationship $FR = $ constant, where F is frequency of the input signal and R is the sweep rate (remember that sweep rate means time per division, and sweep rate and sweep speed are inversely proportional). Therefore, $R/P = $ constant, where P is the period for one cycle of input signal. Once the period P is measured, the sweep rate can be determined and displayed on-screen along with a reconstructed waveform, and graticule scale markers can be generated and placed at the appropriate display positions.

Figure 3:
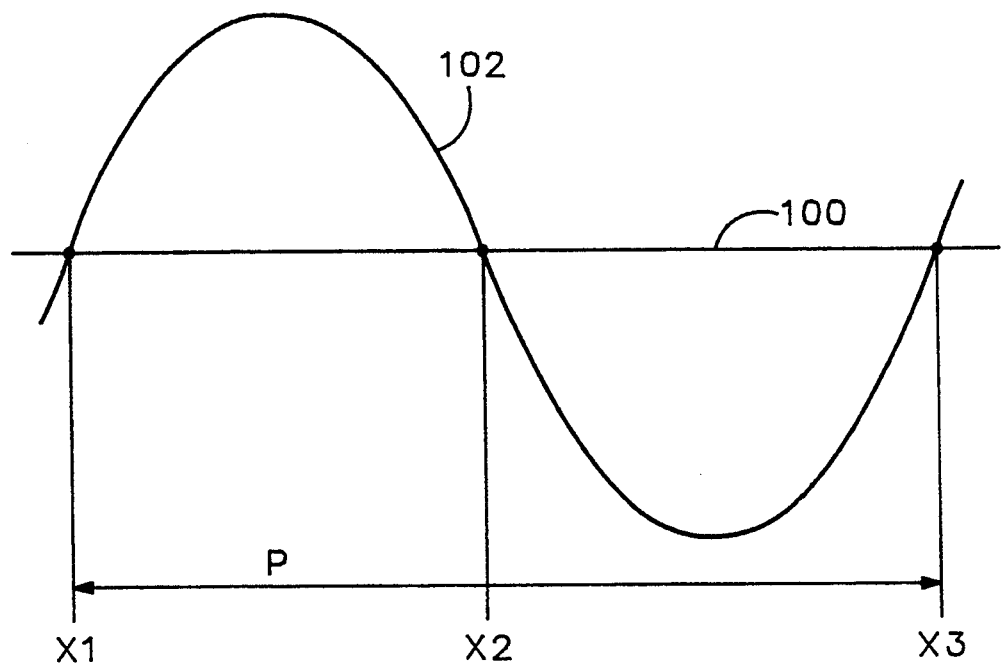
FIG. 3 is a waveform diagram of a repetitive signal for use in explaining how the time period of one cycle of waveform is calculated.

The period P of the acquired signal is determined as follows: Upon completion of a first waveform acquisition, a sample of the waveform trace is retrieved from memory (either FAM 32 or MAM 34) by acquisition unit 30 and its amplitude value determined to establish a reference amplitude. The reference amplitude is represented in FIG. 3 as a horizontal reference line 100 drawn through the waveform 102. It should be noted that the reference amplitude can be located at any vertical position within the peak-to-peak amplitude of the input signal. For a cyclic repetitive signal, it is assumed that if the amplitude of a signal crosses a horizontal reference line three times, the period of the signal can be determined. Acquisition unit 30 compares the amplitude value of each sample with the reference amplitude, and the addresses X1, X2, and X3 of three samples that equal the reference sample are noted. These addresses X1, X2, and X3 are represented by three "crossings" of the horizontal reference line 100 in FIG. 3. CPU 40 then calculates the number of samples occurring between the first and third addresses, or "crossings,", and multiplies the number of samples by the time spacing of the samples, which is known from the current sweep rate $R_0$ and sampling rate in calculating TBRF. That is, the period $P=(X3-X1) \times (R/50)$, where $(X3-X1)$ is the number of samples occurring between address X1 and address X3, and $R_0/50$ is the current sweep rate divided by 50 samples per division.

The physical length L of display screen associated with the period P in display-screen divisions is $L=10/C$, where C is the user-selected number of cycles, or portion of a cycle, of the signal waveform to be displayed over the conventional ten display divisions. Thus, for one cycle of signal waveform to be displayed, each time period will be ten divisions; for two cycles, each time period P will be five divisions in length, and so forth. It should be noted that C is not necessarily an integer because the user may specify any number of cycles, including fractional values.

Before a next waveform is acquired, a new sweep rate $R_1$ is calculated by dividing period P by length L, and a new TBRF is calculated using the new sweep rate. As soon as a waveform and related information is displayed, a new waveform is acquired, and the process is repeated. Thus, the display is repeatedly updated with new waveforms as soon as they are acquired and processed.

The automatic time base mode just described is referred to as a variable automatic time base mode because the oscilloscope user specifies the number of cycles, or portion of a cycle, of a generally repetitive signal waveform to displayed, and the oscilloscope automatically adjusts the time base to keep the selected number of cycles constant over the ten divisions of display. Thus, the sweep rate is variable, and is dictated by the display. Because the width of each displayed cycle is the same, anomalies and aberrations on the waveform can be readily discerned.

Also, an automatic time base mode with 1-2-5 steps can be established by allowing a user to select viewing a signal within a range of number of cycles (for example, between 2 and 6 cycles). In the 1-2-5 steps automatic time base mode, the sweep rates will correspond to those provided by the manual time base mode; however, the sweep rates will be calculated and determined automatically. When the number of cycles of an acquired signal is outside the predetermined range (less than two or greater than six in this example), the sweep rate will be calculated as described above and reduced or increased until a sweep rate is reached that places the signal within the predetermined range before being displayed.

Figure 4:
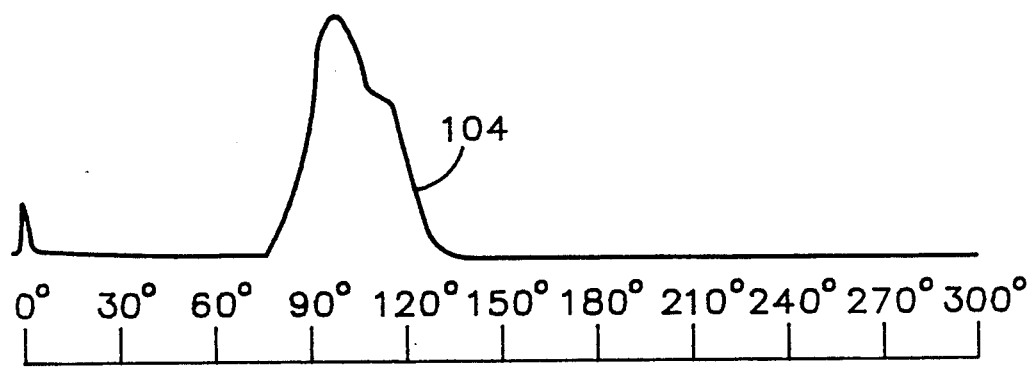
FIG. 4 shows a waveform display in which the horizontal axis is scaled in degrees per division.

The ability of the digital storage oscilloscope of the present invention to automatically establish displays of one or more cycles, or a portion of a cycle, of a generally repetitive signal lends itself to presentation of the horizontal axis in degrees per division rather than time per division as shown in FIG. 4, wherein a waveform 104 is shown in comparison with a scale calibrated in 30 degrees per division for exemplary purposes. In the user-selected degrees time base mode, CPU 40 reads the number of signal cycles and degrees per division parameters provided by user interface 44. Acquisition unit 30 and CPU 40 function in the same manner as described above for calculating TBRF and measuring time period P of a single cycle, with the time period P being converted to 360 degrees. CPU 40 then establishes an appropriate scale to be presented along with the waveform. For example, for a display of a single cycle of signal, a scale of twelve horizontal divisions with 30 degrees per division may be established. Likewise, for a display of two cycles, which is 720 degrees, a scale of twelve horizontal divisions with 60 degrees per division may be established. To view a 90-degree portion of a 720-degree engine cycle of a four-stroke diesel engine (two revolutions of the crankshaft), for example, sufficient record length to store the entire waveform would be required which would allow the operator to scroll to the 90-degree portion desired, and a display of nine scale divisions with ten degrees per division would be established. This suggests that the capacities of FAM 32 and MAM 32 would be at least eight times larger than that of an associated display memory, which has 512 memory locations for waveform storage, assuming a resolution of 50 samples per division in the time mode. Accordingly, the FAM 32 and MAM 34 should be expandable to at least 4K. In the commercial embodiment, as mentioned earlier, the capacities of these memories are actually 32K, partitionable in increments of 16K, 8K, 4K, 2K, 1K, and 0.5K, depending on the operating mode and number of input channels (up to four) being viewed.

A logical extension of the automatic time base control features of the present invention as described herein is correction of non-linearities in the time base. When a reference signal of known and precise frequency is applied to one of the input channels, the variable magnification mechanism can be extended so that it can be used to correct for non-linearity on the horizontal axis. Also, the reference signal can be used to develop calibration factors, that is, the amount of correction needed to adjust the horizontal length to match the length of the known signal can be determined and used to calibrate other sweep rates.

While we have shown and described the preferred embodiment of our invention, it will be apparent to those skilled in the art that many changes and modifications may be made without departing from our invention in its broader aspects. It is therefore contemplated that the appended claims will cover all such changes and modifications as fall within the true scope of the invention.

What we claim as our invention is:

1. An automatic time base for a digital storage oscilloscope having a display screen wherein a predetermined number of waveform points are equally spaced along a horizontal axis, comprising:
   sampling means for producing digitized samples of a repetitive input signal at a constant rate;
   means for comparing the values of said digitized samples with a reference value to determine one cycle of said repetitive input signal;
   means for calculating the time period of said one cycle of said repetitive input signal;
   means for determining a number of digitized samples equal to said predetermined number of waveform points to provide a display on said display screen of at least one cycle of said repetitive input signal; and
   means for converting said number of digitized samples to amplitude values corresponding to said waveform points.

2. An automatic time base in accordance with claim 1 wherein said sampling means comprises a sampling circuit and an analog-to-digital converter, wherein said sampling circuit is operated by a constant frequency sampling clock.

3. An automatic time base in accordance with claim 1 wherein said means for comparing the values of said digitized samples with a reference value to determine one cycle of said repetitive input signal comprises an acquisition unit including a digital signal processor for determining three crossings of said reference value by said digitized samples and identifying the addresses of a first and a third digitized sample corresponding to a first and a third crossing of said reference value.

4. An automatic time base in accordance with claim 3 wherein said means for calculating the time period of said one cycle of said repetitive input signal comprises means for multiplying the number of digitized samples occurring between said first and said third addresses by a time determined by a sweep rate.

5. An automatic time base in accordance with claim 1 wherein the horizontal axis of said display is represented in degrees.

6. In a digital storage oscilloscope, a method of providing an automatic time base, comprising the steps of:
   (a) producing digitized samples of a repetitive input signal at a constant rate;
   (b) comparing the values of said digitized samples with a reference value to determine one cycle of said repetitive input signal;
   (c) calculating the time period of said one cycle of said repetitive input signal;
   (d) determining a number of digitized samples equal to a predetermined number of waveform points defining a horizontal axis of a display screen in order to provide a display of at least one cycle of said repetitive input signal;
   (e) converting said number of digitized samples to amplitude values corresponding to said waveform points; and
   (f) displaying said amplitude values.

* * * * *